United States Patent [19]

Michael

[11] Patent Number: 5,789,932

[45] Date of Patent: Aug. 4, 1998

[54] INTEGRATED CIRCUIT

[75] Inventor: Ewald Michael, Haar, Germany

[73] Assignee: Siemens Aktiengesellschaft, Munich, Germany

[21] Appl. No.: 689,208

[22] Filed: Aug. 5, 1996

[30] Foreign Application Priority Data

Aug. 4, 1995 [DE] Germany .................. 195 28 733.9

[51] Int. Cl.$^6$ .................................................. G01R 31/26
[52] U.S. Cl. ............................................................ 324/765
[58] Field of Search ............................. 324/158.1, 763, 324/764, 765; 371/22.4, 22.5; 307/443

[56] References Cited

U.S. PATENT DOCUMENTS

| | | | |
|---|---|---|---|
| 4,712,061 | 12/1987 | Lach | 324/83 |
| 4,853,628 | 8/1989 | Gouldsberry et al. | 324/73.1 |
| 4,956,602 | 9/1990 | Parrish | 324/537 |
| 5,068,547 | 11/1991 | Gascoyne | 307/443 |
| 5,097,205 | 3/1992 | Toyoda | 324/73.1 |
| 5,248,936 | 9/1993 | Nakata et al. | 324/73.1 |
| 5,446,395 | 8/1995 | Goto | 324/763 |
| 5,457,381 | 10/1995 | Farwell | 324/158.1 |

FOREIGN PATENT DOCUMENTS 38 30 573  4/1989  Germany .

OTHER PUBLICATIONS

Patents Abstracts of Japan, E–365, Dec. 11, 1985, vol. 9, No. 315 and JP–A–60–147127 (OKI) Aug. 3, 1985.

*Primary Examiner*—Ernest F. Karlsen
*Assistant Examiner*—Anh Phung
*Attorney, Agent, or Firm*—Herbert L. Lerner; Laurence A. Greenberg

[57] ABSTRACT

An integrated circuit includes a circuit configuration for receiving a test signal and establishing an output signal as a consequence thereof. A test configuration checks if the output signal is within a given tolerance range. The test configuration has an output at which a corresponding result signal to be transmitted to outside the integrated circuit is generated when testing is performed.

12 Claims, 3 Drawing Sheets

INTEGRATED CIRCUIT

BACKGROUND OF THE INVENTION

FIELD OF THE INVENTION

The invention relates to an integrated circuit.

Circuit components of integrated circuits have characteristic variables with a value that depends on integrated circuit production process variations. Such production process factors pertain, for instance, to material compositions, dopant concentrations, and the thickness, width and length of structures to be made that are components of the circuit components. The characteristic variables affected by those factors include, for instance, resistances, capacitances, operating voltages of transistors, or time lags of input signals through the circuit components.

For instance, it is known in the production of integrated circuits on the wafer level to perform a test of resistance values, in order to be able to find out whether or not their production-dictated fluctuations are within certain tolerance ranges. The meaning of the measurement of values that are within the tolerance range is that the process variations were not so pronounced as to have had a negative impact on the integrated circuit to be produced. The tolerance range must be defined accordingly. The performance of the test is carried out merely in random-sample fashion on the wafer, for a few integrated circuits on the wafer. A test configuration sends test signals to the selected integrated circuits and receives the resultant output signals back again from outside the wafer, through measurement points. Evaluation of the output signals is then carried out outside the integrated circuit. A decision is then made about all of the integrated circuits on the wafer from the result of the test, even though only a few of them have actually been checked. The decision is then made as to whether to continue processing of the wafer or to reject it.

Proceeding in that way is disadvantageous because process variations can also occur within a wafer, and therefore testing of every integrated circuit on the wafer would permit make more accurate rejection. However, testing every integrated circuit on the wafer by the method described above would involve extremely great effort and expense: First, it would require that measurement points on every integrated circuit be contacted with measuring tips of a test apparatus. Second, testing every single integrated circuit would entail a considerable additional expenditure of time in performing the test programs and/or would jam the capacity of the test apparatus being used. Both cases involve major added expense.

SUMMARY OF THE INVENTION

It is accordingly an object of the invention to provide an integrated circuit, which overcomes the hereinaforementioned disadvantages of the heretofore-known devices of this general type and in which simpler testing of factors in a production process affecting circuit components that are a component part of the integrated circuit is possible.

With the foregoing and other objects in view there is provided, in accordance with the invention, an integrated circuit, comprising a circuit configuration for receiving a test signal and establishing an output signal as a consequence thereof; and a test configuration for checking if the output signal is within a given tolerance range, the test configuration having an output at which a corresponding result signal to be transmitted to outside the integrated circuit is generated when testing is performed.

In accordance with another feature of the invention, the test configuration checks if a level of the output signal is within the tolerance range.

In accordance with a further feature of the invention, the test configuration checks if a time lag of the output signal, as compared with the test signal, is within the tolerance range.

In accordance with an added feature of the invention, the circuit configuration includes only one circuit component.

In accordance with an additional feature of the invention, the test signal is supplied at a terminal, and the circuit configuration is exclusively connected to the test configuration and the terminal for supplying the test signal.

In accordance with yet another feature of the invention, the test configuration has a reference configuration for receiving the test signal and consequently establishing an output signal of the reference configuration being equal to the output signal of the circuit configuration if its level or time lag, as compared with the test signal, is at a limit of the tolerance range; and the test configuration has further elements for comparing levels of the output signals of the reference configuration and the circuit configuration or their times lags, as compared with the test signal, with one another.

In accordance with yet a further feature of the invention, the reference configuration is a delay circuit; the test signal has a level change; and the further elements ascertain a chronological order of level changes of the output signals of the reference configuration and of the circuit configuration.

In accordance with yet an added feature of the invention, the delay circuit has a series circuit of logic gates.

In accordance with yet an additional feature of the invention, the test signal is a clock signal of the integrated circuit.

In accordance with again another feature of the invention, there is provided a terminal pin or pad of the integrated circuit being connected to the output of the test configuration.

In accordance with again a further feature of the invention, there is provided a deactivating device having an activation input connected to the output of the test configuration; the deactivating device being put into an activated state by the result signal if a level or a time lag of the output signal of the circuit configuration is outside the tolerance range, and otherwise being put into a deactivated state; an input or output of the integrated circuit being a terminal pin or pad connected to the deactivating device; and the input or output being deactivatable for preventing it from performing its function as an input or output by putting the deactivating device into the activated state, and being unaffected by the deactivating device in the deactivated state of the deactivating device.

In accordance with a concomitant feature of the invention, the test configuration is activatable and deactivatable.

The invention makes it possible to not merely test an individual circuit component but to selectively test an entire circuit configuration, which has a plurality of circuit components. The influence of the production process on the function of such a circuit configuration is the result of individual factors affecting the circuit components contained in it.

In the integrated circuit of the invention, it is possible to test individual circuit components or circuit configurations by supplying them with suitable test signals and evaluating resultant output signals through the use of a test configuration on the integrated circuit. To that end, depending on the type of characteristic variable to be tested, the level of the output signal or its time lag as compared with the test signal can be tested.

The test signal can be delivered to the circuit configuration either during the normal operating mode or during a special test mode.

In contrast to the prior art described above, it is possible with the invention to test production factors separately for each integrated circuit on a wafer, as long as every integrated circuit is constructed in accordance with the invention. A selection of the integrated circuits can then be made individually, that is circuit by circuit.

If the circuit configuration is supplied with the test signal, but it is otherwise connected solely to the test configuration, and not to any other circuit component of the integrated circuit that is contemplated for some function of the integrated circuit other than the testing according to the invention, then the integrated circuit can be operated independently of the testing according to the invention. For instance, it is then possible on the wafer level to perform a function test of the integrated circuit simultaneously with the testing according to the invention. No special type of test mode is necessary. This saves time as compared with the prior art. Since the test configuration is a component of the integrated circuit, no external test apparatus has to be provided for the testing according to the invention, either.

The result of the testing can either be transmitted to a terminal of the integrated circuit, or else it can be used by a deactivating device for deactivating an input or output of the integrated circuit. In this latter case, the result of the testing is especially easily ascertained. However, deactivating the input or output causes the input or output to be unable to perform its function as an input or output (for example, because it will have been disconnected from the units of the integrated circuit to which it had previously been connected) due to the opening of a switch, and thus especially severely impairs the function of the integrated circuit.

The test configuration may carry out a test of the circuit configuration during every operation of the integrated circuit, so as to ensure that even output signal values outside the tolerance range that occur later still lead to an appropriate display or indication, through the use of the result signal sent outside the integrated circuit.

Due to the invention, the above-mentioned wafer-level tests of the prior art, in the form described, can also be dispensed with. Instead, for each integrated circuit on the wafer, the result of the test can be ascertained during one of the usual function tests of the integrated circuit that are to be performed. This can be carried out without special test routines, thereby saving the time required for performing them. It is especially advantageous for this to be achieved by the already-mentioned deactivation of an input or output of the integrated circuit by the result signal through the use of the deactivation device, since a deactivation of an input or output can be ascertained very quickly through the use of a function test that must be performed often anyway.

It is sufficient if only one circuit component of the same type (that is, one resistor, capacitor, coil and/or transistor) on each integrated circuit is provided with a test configuration according to the invention. These components are then testable as representatives for all of the circuit components which are identical to them.

If the circuit configuration has a plurality of circuit components, the invention makes it possible to test an output signal of this circuit configuration that is normally not accessible to the integrated circuit, or is accessible only during a specific testing mode. This is especially advantageous in the case of complicated circuit chains, which include a series circuit of a plurality of circuit configurations.

Circuit configurations having a function which is affected especially markedly by the production process, but in which that function cannot readily be tested from outside the integrated circuit, are intended above all to be provided with the test configuration of the invention.

It can be contemplated for the test configuration to be activatable and deactivatable. This can be carried out, for instance, by putting it into a type of test mode or normal operating mode in a known way. It is also possible to provide separable or closable connections (transistors or fuses and antifuses), through the use of which an activation or deactivation of the test configuration is effected.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
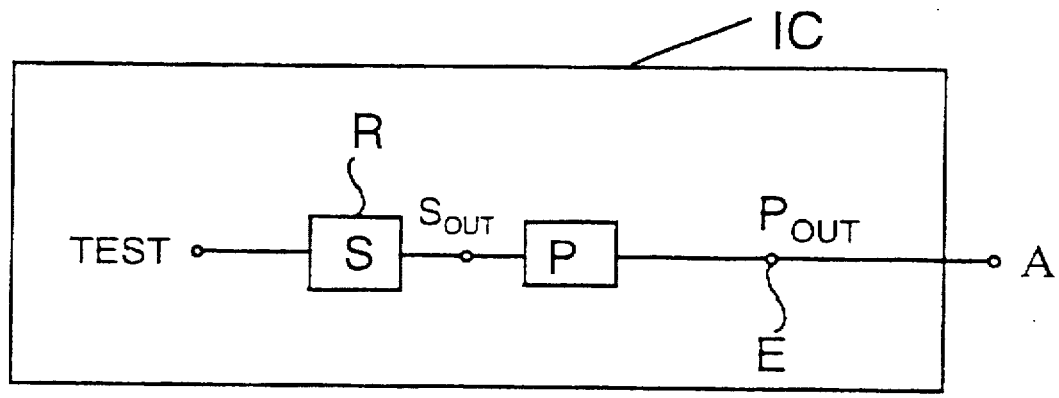
FIGS. 1 and 2 are schematic circuit diagrams of exemplary embodiments of an integrated circuit according to the invention.

Referring now to the figures of the drawings in detail and first, particularly, to FIG. 1 thereof, there is seen an integrated circuit IC, which has a circuit configuration S and a test configuration P connected thereto. The circuit configuration S has a characteristic variable with a value that depends on variations in the production process of the integrated circuit IC. A test signal TEST can be applied to the circuit configuration S, resulting in an output signal $S_{OUT}$, which can be supplied to the test configuration P. Through the use of the test configuration P, it is possible to check whether or not the level of the output signal $S_{OUT}$ or its time lag over the test signal TEST is within a tolerance range. The tolerance range can be defined in such a way that for levels or time lags of the output signal $S_{OUT}$ that are outside the tolerance range, the circuit configuration S no longer reliably assures the capability of the integrated circuit IC to function. In that case, the integrated circuit IC should not continue to be used.

Defining such tolerance ranges does not present any problem to one skilled in the art, because they are conventionally defined for every integrated circuit IC by so-called specifications or by timing diagrams.

An output $P_{OUT}$ of the test configuration P is connected to a terminal pin or pad A of the integrated circuit IC. A result signal E can be generated at the output $P_{OUT}$ by the test configuration P. The result of the testing can be transmitted outside the integrated circuit IC through the use of the result signal E. By way of example, the result signal E can have two levels. It assumes one level if the level, or the time lag, of the output signal $S_{OUT}$ is within the tolerance range, and the other level if it is not.

A concrete exemplary embodiment for the circuit configuration S and the test configuration P will be described below in conjunction with FIG. 3.

Figure 2:
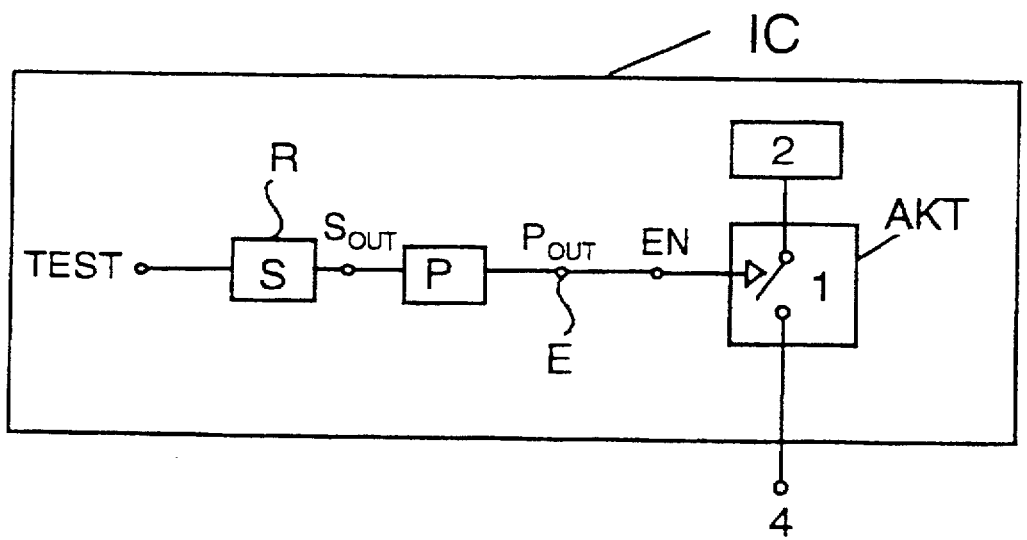

FIG. 2, in a modification of FIG. 1, shows an exemplary embodiment of the invention in which the output $P_{OUT}$ of the test configuration P is connected to an activation input EN of a deactivating device AKT. The deactivating device AKT can be put into an activated and a deactivated state by way of the result signal E that is applied in this way to the activation input EN. The deactivating device AKT has a switch 1, which is closed in its deactivated state and which is disposed between an input or output 4 of the integrated circuit IC and units 2 of the integrated circuit IC, for which that input or output 4 acts as an input or output. If the deactivating device AKT is in the activated state, then the switch 1 is open, and thus the input or output 4 is disconnectable from the units 2.

In this exemplary embodiment of the invention, if the result signal E indicates a negative result of the testing, the input or output 4 is deactivated by the deactivating device AKT. If the input or output 4 is an input, then it is not possible to forward input signals to the units 2 by way of it. If the input or output 4 is an output, then no output signals of the units 2 can be received at it. In both cases, the function of the integrated circuit IC is especially severely affected by the result signal E if the outcome of the testing has been negative, or in other words, if the level or the time lag of the output signal $S_{OUT}$ is outside the tolerance range. The outcome of the testing is then especially easily ascertained from outside the integrated circuit IC. If the outcome of the test is negative, the integrated circuit IC should not be used any longer.

The terminal A in FIG. 1 and the input or output 4 in FIG. 2 can be terminal pads in the case of a packageless integrated circuit IC, and terminal pins in the case of an integrated circuit IC housed in a package.

A concrete exemplary embodiment for the test configuration P and the circuit configuration S will now be described in conjunction with FIG. 3. The illustrated circuit configuration S includes only one circuit component, in the form of a resistor R. This resistor has a first terminal SA and a second terminal SB. Its ohmic resistance (that is, its characteristic variable) is dependent on production factors. The test configuration P has a reference configuration V, which is a delay circuit that contains three inverters I in the exemplary embodiment. The delay circuit has an input VA and an output VB. The input VA of the delay circuit and the first terminal SA of the resistor R, which are connected to one another, can be supplied with the test signal TEST through one input $P_{IN}$ of the test configuration P. As is shown in FIG. 4, the test signal TEST exhibits a change of level.

In addition, the test configuration P has further elements 3, with which a comparison can be made of an output signal $V_{OUT}$ at the output VB of the delay circuit with an output signal $S_{OUT}$ at the second terminal SB of the resistor. To that end, the second terminal SB of the resistor R is connected to a gate of a first n-channel transistor T1, and the output VB of the delay circuit is connected to a gate of a second n-channel transistor T2. The second transistor T2 and the first transistor T1 are disposed between the output $P_{OUT}$ of the test configuration P and a first supply potential, ground, of the integrated circuit IC. A third n-channel transistor T3, which is connected as a diode and a fourth n-channel transistor T4, as well as a fifth n-channel transistor T5 and a sixth n-channel transistor T6 parallel thereto, are located between a second supply potential VCC of the integrated circuit IC and the first supply potential, i.e. ground. The drain of the fourth transistor T4 and the gate of the sixth transistor T6 are connected to one another, as are the drain of the sixth transistor T6 and the gate of the fourth transistor T4. In addition, the drain of the fourth transistor T4 is connected to the output $P_{OUT}$ of the test configuration P. The input VA of the delay circuit is connected to the gate of the fifth transistor T5.

The function of the exemplary embodiment of the test configuration P shown in FIG. 3 will now be described in terms of the signal courses shown in FIG. 4: A time lag of a level change in the test signal TEST by the delay circuit is dimensioned in such a way that it corresponds to an upper limit of the tolerance range for the delay through the resistor R. However, the delay through the resistor R is dependent on its ohmic resistance. FIG. 4 illustrates the case in which the delay through the circuit component S is less than through the delay circuit. The level change of the output signal $S_{OUT}$ of the circuit component S therefore occurs earlier than the level change of the output signal $V_{OUT}$ of the delay circuit.

Figure 3:
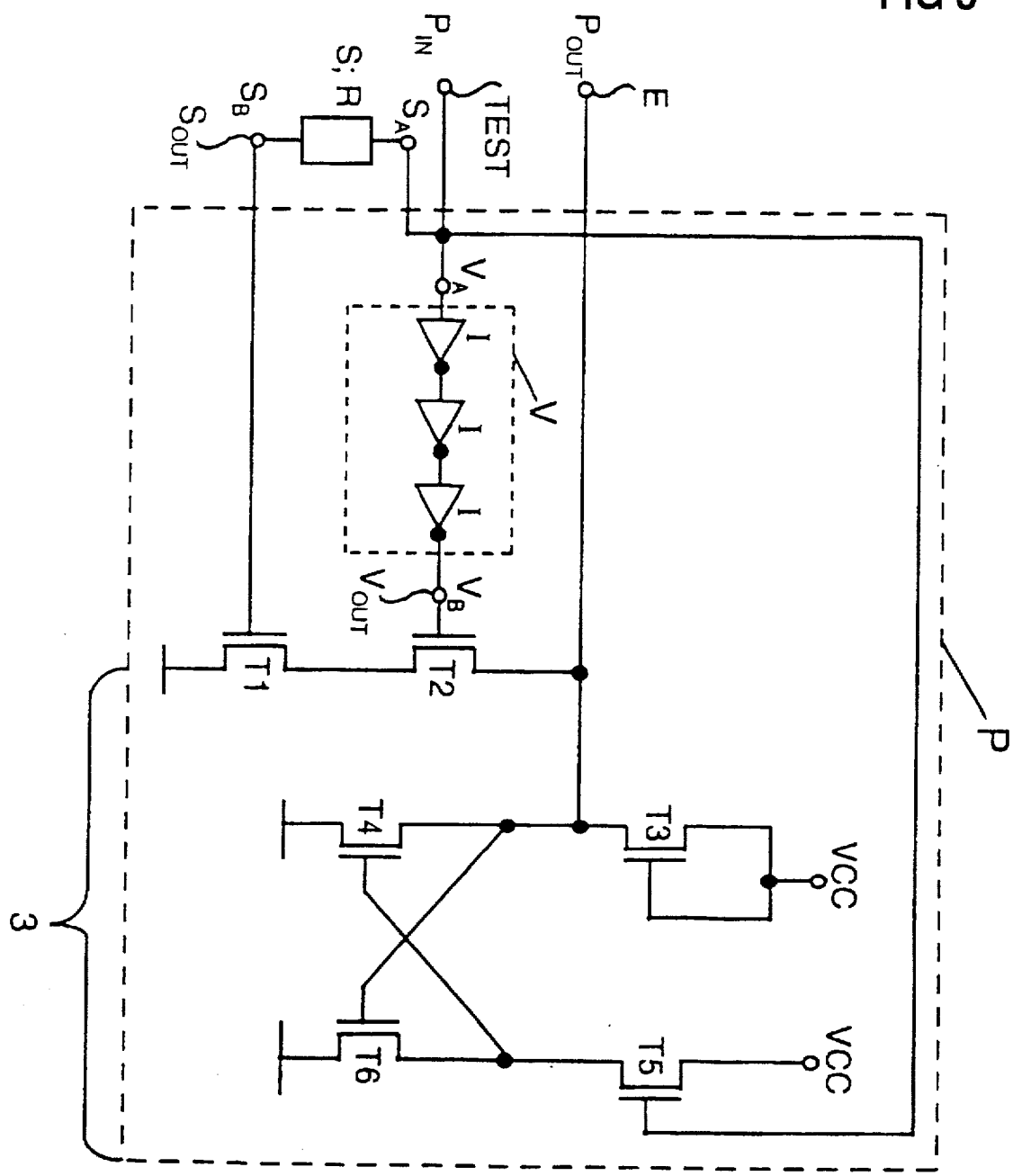
FIG. 3 is a circuit diagram of an exemplary embodiment of a test configuration of the invention.
Figure 4:
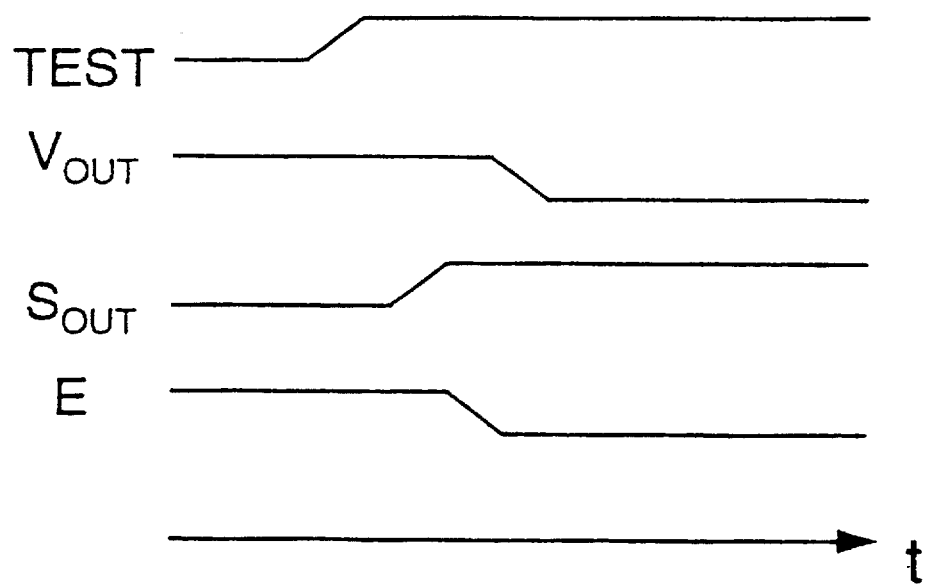
FIG. 4 is a diagram showing signal courses that occur in the test configuration of FIG. 3.

Through the use of the third transistor T3 in FIG. 3, the result signal E at the output $P_{OUT}$ of the test configuration P is kept at the value of the second supply potential VCC until such time as the first transistor T1 opens, before the second transistor T2 closes. It is only in that case that a level change to the value of the first supply potential, ground, occurs for the result signal E. A flip-flop that is formed by the third through sixth transistors T3-T6 assures that whatever level the result signal E has is maintained.

If the circuit component S in FIG. 3 were to have an excessive ohmic resistance, one that caused a delay outside the previously defined tolerance range, then the level change in the output signal $S_{OUT}$ of the circuit component S would come later than that of the output signal $V_{OUT}$ of the delay circuit. The result signal E would not undergo a level change and instead would remain at the value of the second supply potential VCC.

The test signal TEST may, for instance, be a clock signal of the integrated circuit IC. However, it is also possible to use any other signal that exhibits a level change in the last exemplary embodiment described above.

In the exemplary embodiment of FIG. 3, the circuit configuration S is connected only to the test configuration P, but not to any other circuit component of the integrated circuit IC. Such a circuit configuration S cannot be used to perform any other functions than that of testing according to the invention. It may be a component, along with identical circuit configurations, of the same integrated circuit IC. In that case it is highly advantageous that it can be tested as a representative example for the circuit configurations identical to it (in the exemplary embodiment of FIG. 3, these would once again be individual resistors), and that the outcome of the testing is used to evaluate the functional capability of the entire integrated circuit IC. In this way, influence of the testing on the normal functions of the integrated circuit IC is avoided.

By way of example, one resistor R, one capacitor, one transistor, and so forth, each serving as a one circuit configuration S, may each be provided, along with a corresponding test configuration P, on an integrated circuit IC.

I claim:

1. An integrated circuit, comprising:

a circuit configuration for receiving a test signal and consequently establishing an output signal; a test configuration for checking if the output signal is within a given tolerance range, said test configuration having an output at which a corresponding result signal to be transmitted to outside the integrated circuit is generated when testing is performed;

a deactivating device having an activation input and a switchable current conducting path with an end, said activation input receiving the output of said test configuration for switching said current conducting path; and an input/output terminal connected to said deactivating device, said input/output terminal being deactivatable for preventing it from performing its function as an input and output by putting said deactivating device into an activated state, and being unaffected by said deactivating device in a deactivated state of said deactivating device.

2. The integrated circuit according to claim 1, including:

units connected to said end of said current conducting path of said deactivating device;

said current conducting path being switched between said input/output terminal and said activation input; and said deactivating device being put into an activated state by the corresponding result signal if a level or a time lag of the output signal of said circuit configuration is outside the tolerance range.

3. The integrated circuit according to claim 1, wherein said test configuration checks if a time lag of the output signal, as compared with the test signal, is within the tolerance range.

4. The integrated circuit according to claim 1, wherein said circuit configuration includes only one circuit component.

5. The integrated circuit according to claim 1, wherein the test signal is supplied at a terminal, and said circuit configuration is exclusively connected to said test configuration and said terminal for supplying the test signal.

6. The integrated circuit according to claim 1, wherein:

said test configuration has a reference configuration for receiving the test signal and consequently establishing an output signal of said reference configuration being equal to the output signal of said circuit configuration if its level or time lag, as compared with the test signal, is at a limit of the tolerance range; and said test configuration has further elements for comparing levels of the output signals of said reference configuration and said circuit configuration or their times lags, as compared with the test signal, with one another.

7. The integrated circuit according to claim 6, wherein:

said reference configuration is a delay circuit;

the test signal has a level change; and said further elements ascertain a chronological order of level changes of the output signals of said reference configuration and of said circuit configuration.

8. The integrated circuit according to claim 7, wherein said delay circuit has a series circuit of logic gates.

9. The integrated circuit according to claim 1, wherein the test signal is a clock signal of the integrated circuit.

10. The integrated circuit according to claim 1, including a terminal pin or pad of the integrated circuit being connected to the output of said test configuration.

11. The integrated circuit according to claim 1, wherein:

said deactivating device being put into the activated state by the result signal if a level or a time lag of the output signal of said circuit configuration is outside the tolerance range, and otherwise being put into the deactivated state; and said input/output terminal is a terminal pin or pad connected to said deactivating device.

12. The integrated circuit according to claim 1, wherein said test configuration is activatable and deactivatable.

* * * * *